United States Patent [19]
Smith et al.

[11] Patent Number: 5,149,596
[45] Date of Patent: Sep. 22, 1992

[54] VAPOR DEPOSITION OF THIN FILMS

[75] Inventors: David C. Smith; Stevan G. Pattillo; Joseph R. Laia, Jr.; Alfred P. Sattelberger, all of Los Alamos, N. Mex.

[73] Assignee: The United States of America as represented by the United States Department of Energy, Washington, D.C.

[21] Appl. No.: 593,839

[22] Filed: Oct. 5, 1990

[51] Int. Cl.$^5$ .................... C23C 16/18; C23C 16/44; B32B 15/00
[52] U.S. Cl. .................. 428/656; 428/457; 428/938; 427/252; 427/255.1
[58] Field of Search ............. 428/606, 663, 664, 665, 428/668, 670, 655, 938, 457, 656; 427/252, 255.1

[56] References Cited

U.S. PATENT DOCUMENTS

| | | | |
|---|---|---|---|
| 4,460,618 | 7/1984 | Heinecke et al. | 427/255 |
| 4,818,560 | 4/1989 | Ishihara et al. | 427/255.1 |
| 4,830,891 | 5/1989 | Nishitani et al. | 427/255 |
| 4,835,005 | 5/1989 | Hirooka et al. | 427/255.1 |
| 4,869,930 | 9/1989 | Clarke et al. | 427/252 |
| 4,886,683 | 12/1989 | Hoke et al. | 427/252 |
| 4,992,299 | 2/1991 | Hochberg et al. | 427/255.1 |
| 5,019,415 | 5/1991 | Oehr et al. | 427/255.1 |

FOREIGN PATENT DOCUMENTS

| | | | |
|---|---|---|---|
| 58-161766 | 9/1983 | Japan | 427/252 |
| 58-161766 | 9/1983 | Japan | 427/252 |
| 58-161769 | 9/1983 | Japan | 427/252 |
| 61-221376 | 10/1986 | Japan | 427/252 |
| 62-253770 | 11/1987 | Japan | 427/252 |

OTHER PUBLICATIONS

H. D. Kaesz et al. in Chemical Perspectives on Microelectronic Materials; edited by M. E. Gross et al., Material Research Society Synposium Proceeding No. 131, pp. 395-400 (1989).

A. Etspuler et al., Appl. Phys, A 48, 373-375 (1989) describe a plasma-enhancedchemical vapor deposition of thin films of rhodium from a single stream including an organometallic precursor of dicarbonyl-2,4-pentationato-rhodium, an inert carrier gas and hydrogen.

Yea-jer Chen et al. Appl. Phys. Lett. 53(17), 1591-1592 (1988) describe low temperature organometallic chemical vapor deposition of platinum by decomposition of cyclopentadienyl platium trimethyl in a reaction chamber including separately introduced hydrogen gas.

Chem. Abst., vol. 109:15292q (1988) describes indirect plasma chemical vapor deposition of metal films from metal halides and a plasma of a H-inert gas mixture.

Chem. Abst., vol. 106:187074z describes plasma vapor phase deposition of thin metal films by utilization of a metal halides and a reducing gas, e.g., H.

*Primary Examiner*—John Zimmerman
*Attorney, Agent, or Firm*—Bruce H. Cottrell; Paul D. Gaetjens; William R. Moser

[57] ABSTRACT

A highly pure thin metal film having a nanocrystalline structure and a process of preparing such highly pure thin metal films of, e.g., rhodium, iridium, molybdenum, tungsten, rhenium, platinum, or palladium by plasma assisted chemical vapor deposition of, e.g., rhodium(allyl)$_3$, iridium(allyl)$_3$, molybdenum(allyl)$_4$, tungsten(allyl)$_4$, rhenium(allyl)$_4$, platinum(allyl)$_2$, or palladium(allyl)$_2$ are disclosed. Additionally, a general process of reducing the carbon content of a metallic film prepared from one or more organometallic precursor compounds by plasma assisted chemical vapor deposition is disclosed.

24 Claims, 1 Drawing Sheet

5,149,596

VAPOR DEPOSITION OF THIN FILMS

FIELD OF THE INVENTION

The present invention relates to the field of thin metal films and to processes for chemical vapor deposition of thin metal films. In addition, the present invention relates to improvements in the field of chemical vapor deposition of thin metal films from organometallic precursors whereby the carbon content of the film is minimized. This invention is the result of a contract with the Department of Energy (Contract No. W-7405-ENG-36).

BACKGROUND OF THE INVENTION

The ability to grow various types of thin films at low temperatures, i.e., less than about 300° C., is of increasing importance. Thin films of, e.g., rhodium and iridium, are useful in oxidative protection applications, as reflective coatings for mirrors in optics, and in the micro-electronics industry.

Iridium films have been previously deposited using iridium halides and molecular hydrogen. Iridium films have also been deposited on silicon using laser stimulated deposition from gaseous and condensed iridium tris(acetylacetone).

Rhodium films have been prepared by sputtering techniques, vacuum deposition techniques, and by a technique involving the thermal decomposition of $[Rh(CO)_2Cl]_2$. Rhodium films have also been deposited by a plasma-enhanced chemical vapor deposition process as described by Espuler et al., Appl. Phys. A 48, 373–375 (1989). In that process, a single gaseous stream including an inert carrier gas, the organometallic precursor compound, i.e., dicarbonyl-2,4-pentationato-rhodium, and hydrogen gas is passed into a parallel plate reactor wherein a plasma is generated.

However, many of the previous methods generally suffer from the need for excessively high substrate temperatures thereby preventing the use of a temperature sensitive substrate, or suffer from low deposition rates. In addition, metal films produced by some of the previous methods have been inferior films in terms of: (a) purity due to either carbon or halide contamination; (b) morphology as such films typically are either amorphous or polycrystalline (i.e., a wide variety of crystal sizes) in structure; or (c) stability of the resultant film due to internal stresses within the material. Carbon contamination of films produced from organometallic precursors has generally been a major problem.

Accordingly, it is an object of this invention to achieve a low temperature chemical vapor deposition process allowing for the production of highly pure thin films of, e.g., rhodium, iridium, molybdenum, tungsten, rhenium, platinum, or palladium on temperature sensitive substrates, e.g., plastics or semiconductors.

Another object of this invention is to provide a highly pure nanocrystalline film of rhodium, iridium, molybdenum, tungsten, rhenium, platinum, or palladium, such film substantially free of carbon contamination.

Still another object of this invention is to provide an article including a temperature sensitive substrate having a thin film of iridium or rhodium coated thereon.

It is yet a further object of this invention to provide a process capable of reducing the carbon contaminant content of a metallic film prepared from one or more organometallic precursor compounds.

SUMMARY OF THE INVENTION

To achieve the foregoing and other objects, and in accordance with the purposes of the present invention, as embodied and broadly described herein, the present invention provides a nanocrystalline film of rhodium, iridium, molybdenum, tungsten, rhenium, platinum, or palladium, a coated article including a thermally sensitive substrate having a nanocrystalline thin film coating of rhodium, iridium, molybdenum, tungsten, rhenium, platinum, or palladium thereon, and a process of forming a nanocrystalline film of rhodium, iridium, molybdenum, tungsten, rhenium, platinum, or palladium. The nanocrystalline film of the present invention is comprised of a substantially carbon-free, high purity metal selected from the group consisting of rhodium, iridium, molybdenum, tungsten, rhenium, platinum, or palladium, such a film having a metal content of at least 97% by weight, having a thickness of from about 10 nanometers to about 250 nanometers, and having a crystalline structure therein with a metallic grain size of from about 2 to about 40 nanometers, such a film further characterized as having a substantially narrow distribution of crystal grain sizes within the film. The coated article of the present invention involves an article comprised of a thermally sensitive substrate having a nanocrystalline thin film coating thereon, said coating comprised of a substantially carbon-free, high purity metal selected from the group consisting of rhodium, iridium, molybdenum, tungsten, rhenium, platinum, or palladium, such a film having a metal content of at least 97% by weight, having a thickness of from about 10 nanometers to about 250 nanometers, and having a crystalline structure therein with a metallic grain size of from about 2 to about 40 nanometers, such a film further characterized as having a substantially narrow distribution of crystal grain sizes within the film. The present invention further provides a nanocrystalline film comprised of a substantially carbon-free, high purity metal selected from the group consisting of rhodium, iridium, molybdenum, tungsten, rhenium, platinum, or palladium, such film having a metal content of at least 97% by weight, having a thickness of from about 10 nanometers to about 250 nanometers, and having a crystalline structure therein with a metallic grain size of from about 2 to about 40 nanometers, such a film further characterized as having a substantially narrow distribution of crystal grain sizes within the film wherein the nanocrystalline film is prepared by the process involving passing: (a) a first gaseous stream including a precursor compound selected from the group consisting of rhodium(allyl)$_3$, iridium (allyl)$_3$, molybdenum(allyl)$_4$, tungsten(allyl)$_4$, rhenium(allyl)$_4$, platinum(allyl)$_2$, or palladium(allyl)$_2$, and an inert gas; and, (b) a second gaseous stream including a hydrogen plasma, onto a heated target substrate for sufficient time to form said film, said substrate heated at temperatures sufficient to decompose the precursor compound.

The present invention still further provides a process of forming a substantially carbon-free, high purity film of a metal selected from the group consisting of rhodium, iridium, molybdenum, tungsten, rhenium, platinum, or palladium, such a film having a metal content of at least 97% by weight, having a thickness of from about 10 nanometers to about 250 nanometers, and having a crystalline structure therein with a metallic grain size of from about 2 to about 40 nanometers, said process involving passing: (a) a first gaseous stream including a precursor compound selected from the group consisting of rhodium(allyl)$_3$, iridium(allyl)$_3$, molybdenum(allyl)$_4$, tungsten(allyl)$_4$, rhenium(allyl)$_4$, platinum(allyl)$_2$, or palladium(allyl)$_2$, and an inert gas; and, (b) a second gaseous stream including a hydrogen plasma, onto a heated target substrate for sufficient time to form said carbon-free metal film, said substrate heated at temperatures sufficient to decompose the precursor compound.

In another aspect of the present invention, a process of reducing the carbon contaminant content of a metallic film prepared from one or more organometallic precursor compounds is provided, said process comprising passing both a first gaseous stream and a second gaseous stream onto a heated target substrate for sufficient time to form a substantially carbon-free metal film, the first gaseous stream including an inert gas and one or more organometallic precursor compounds for said metallic film, and the second gaseous stream including a hydrogen plasma, said substrate heated at temperatures sufficient to decompose the one or more precursor compounds.

BRIEF DESCRIPTION OF THE DRAWING

The FIGURE shows a side view of an apparatus useful in one exemplification of the invention.

DETAILED DESCRIPTION

Figure 1:
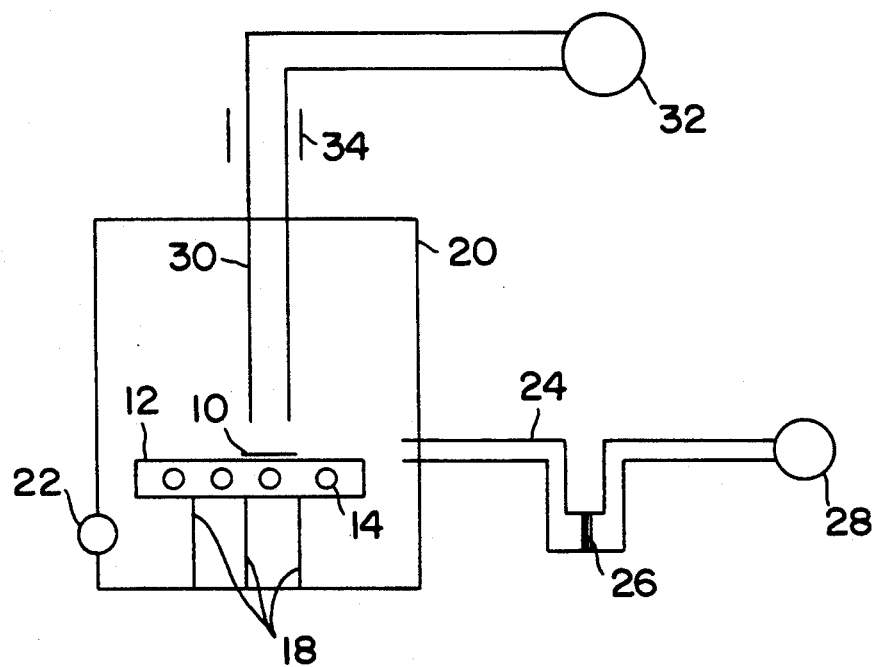

The present invention concerns highly pure nanocrystalline metallic films, e.g., rhodium films and iridium films, and a process of preparing such films including a low temperature process enabling the application of such films to temperature sensitive substrates, e.g., plastics. Another distinct aspect of the invention concerns a process of reducing the carbon content of metallic films prepared from one or more organometallic precursor compounds whereby substantially carbon-free metallic films can be prepared.

An apparatus used in the present plasma-assisted organometallic vapor deposition process is shown in the FIGURE. Target substrate 10 is placed upon support 12 which has a plurality of tubular passages 14. Cartridge heaters 16 situated within tubular passages 14 are used to heat the target substrate. Thermocouples 18 are used to measure the temperature of the target substrate. The target substrate 10 is located within chamber 20 which can be evacuated to reduced pressure by pump 22. An inlet tube 24 is positioned such that the gaseous stream, including the organometallic precursor compound volatilized from glass frit 26 by inert carrier gas as it passes from tank 28 into chamber 20, passes over the target substrate 10. A second inlet tube 30 is positioned such that the plasma stream, generated as hydrogen gas passes from tank 32 through microwave excitation area 34 on way from tank 32 into chamber 20 enters directly onto target substrate 10 in line of sight fashion.

The highly pure nanocrystalline metallic films of the present invention are prepared from organometallic precursor compounds, more specifically from tris(allyl) compounds of rhodium and iridium, from tetra(allyl) compounds of molybdenum, tungsten, and rhenium, and from bis(allyl) compounds of platinum and palladium. Such bis(allyl), tris(allyl), and tetra(allyl) compounds are important in the preparation of the nanocrystalline metallic films as such precursor compounds are air-stable, have high volatility, have low molecular weight, are photolytically stable and have a high carbon to metal ratio.

By "nanocrystalline" is meant crystal sizes ranging from about 1 to about 100 nanometers in diameter, more preferably from about 2 to about 40 nanometers in diameter.

The films of the present invention are highly pure in metal content and are substantially free of carbon or chlorine impurities typically found in such films prepared by earlier processes such as by thermal decomposition of [Rh(CO)$_2$Cl]$_2$, or by the process employed by Etspuler et al described above. By "highly pure" is meant a purity of at least 97% by weight, more preferably a purity of at least 98% by weight and most preferably a purity of at least 99% by weight. For best accuracy in analysis of metal films at these purity levels, it is preferred to rely upon electron microprobe analysis and Rutherford backscattering spectroscopy (RBS). These techniques are considered more accurate analytical techniques than atomic adsorption spectroscopy. Electron microprobe analysis is described in a series of articles by Sewell et al., J. Phys. D: Appl. Phys. 18 (1985) 1233–1243, 1245–1268, and 1269–1270, by Love et al., J. Phys. D: Appl. Phys. 11 (1978) 1369, by Bastin et al., X-Ray Spectrometry, 13 (1984) 91, and by Beaman et al. in ASTM Special Technical Publication 506 (1972), the teachings of which are hereby incorporated by reference. The films of the present invention are characterized as being substantially carbon-free, i.e., having a carbon content of 2% by weight or less, more preferably, a carbon content of 1% by weight or less. The films are also characterized by being essentially chlorine-free, i.e., substantially less than 1% by weight or essentially zero percent by weight.

The metallic films of the present invention are generally from about 10 nanometers to about 250 nanometers in thickness, more preferably from about 30 nanometers to about 200 nanometers in thickness, although the thickness can be greater if the process is conducted for a greater period of time.

The nanocrystalline films of the present invention generally have a metallic grain size of from about 2 to about 40 nanometers and the films further are found to have a substantially narrow distribution of crystal grain sizes, i.e., the standard deviation in the measured crystal grain sizes is generally less than about three sigma. Nanocrystalline films of rhodium in the present invention, for example, have generally been found to have a metallic grain size of from about 2 to about 40 nanometers and a substantially narrow distribution of crystal grain sizes of plus or minus about a half to a third of the observed average. Nanocrystalline films of iridium, for example, have generally been found to have a metallic grain size of from about 2 to about 8 nanometers and a substantially narrow distribution of crystal grain sizes of about a third or less of the observed average, generally plus or minus about 1 nanometer.

In the present process, a first gaseous stream is passed into the reaction zone in the vicinity of a target substrate, preferably simultaneously, as a second gaseous stream is passed into the reaction zone also in the vicinity of the target substrate. The first gaseous stream includes an inert gas or carrier gas such as argon, helium or nitrogen, preferably argon, and the volatilized organometallic precursor compound. The second gaseous stream initially includes a flow of hydrogen gas which is converted into a hydrogen plasma by conventional techniques, such as microwave or RF.

The present process of preparing the nanocrystalline metallic films can be conducted at relatively low temperature of from about 200 degrees Celsius (°C.) to about 300° C., preferably from about 225° C. to about 275° C. The temperature must be sufficient to decompose the organometallic precursor compound. Such temperatures allow for use of thermally sensitive substrates such as plastics, specialty glasses, and semiconductors. By "thermally sensitive substrates" is meant a substrate that suffers detrimental effects upon exposure to excessive temperature generally temperatures above about 200° C. to 250° C. Other suitable substrates, not typically temperature sensitive, may include specialty glasses, and certain alloys.

The present invention also affords a procedure for the control of carbon contamination content of a metallic film prepared from one or more organometallic precursor compounds. Organometallic precursor compounds that may be used in such a process include the allyl compounds described above and other organometallic compounds well known to those skilled in the art including, for example, tetrakis(neopentyl)-titanium, -zirconium or -hafnium; tris(alkyl)indium; tris(alkoxy)indium, bis(alkyl)indium-alkoxide; tris(thiolate)indium; bis(alkyl)indium thiolate; tris(alkyl)aluminum; tetrakis-(amido)-titanium, -zirconium or -hafnium; bis(cyclopentadienyl)-chromium, -iron, -ruthenium, -cobalt or -nickel; and bis(arene)-niobium or -chromium.

The present invention is more particularly described in the following examples which are intended as illustrative only, since numerous modifications and variations will be apparent to those skilled in the art.

EXAMPLE A

Into about 50 milliliters (ml) of tetrahydrofuran (THF) was dissolved iridium tris(acetylacetone), 0.5 grams (g). To this solution was added 5 ml of allyl magnesium chloride (a 2 Molar solution in THF). The resultant admixture was heated at reflux for about 24 hours. The solution was then cooled to room temperature after which dry ice was added with stirring to decompose residual allyl magnesium chloride. The THF was removed at room temperature under vacuum. About 75 ml of hexane was added to the remaining solids and the undissolved solids were separated by filtering. The hexane filtrate was concentrated to about 5 ml under vacuum at room temperature. This solution was transferred to a sublimation apparatus and the remaining hexane was slowly removed under vacuum. Cheesecloth was placed over the solid residue to prevent spalling and the solid was sublimed at a reduced pressure of about 10 to 20 millitorr at about 30° to 40° C. for 4 hours. The resultant product was indicated to be iridium tris allyl by NMR and weighed 0.17 g for a percent yield of 53%.

EXAMPLE 1

A cold wall reactor for the deposition process included a first inlet tube for injecting a precursor complex and an inert gas carrier stream, a second inlet tube for injecting a plasma stream, and a heated glass target substrate mounted within the carrier stream flow. A flow of 15 cubic centimeters of argon per minute was passed over a frit holding iridium tris allyl complex and injected through the first inlet tube into the apparatus for a period of about eight hours. The precursor complex was heated in an oil bath at 52° C. A hydrogen stream of 25 cubic centimeters per minute was converted into a plasma stream by application of microwave power at about 4 Watts per square centimeter (W/cm$^2$) and simultaneously injected onto the target substrate through the second inlet tube situated about ½ inch from the target substrate. The target substrate was heated at 250° C. by thermocouples connected to the substrate. The total pressure of the reactor system was maintained at from about 350 to 375 torr.

After the completion of the run a dark circle of metal could be observed directly under the plasma inlet tube. Analysis by electron microprobe analysis and RBS showed a composition of 97% iridium and 2% carbon within the accuracy of the measurement. Transmission electron micrographs of the metal film at 21° C. showed a very fine grained structure with metal grain sizes of about 3 nanometers plus or minus 1 nanometer.

EXAMPLE 2

A similar run to example 1 was conducted using rhodium tris allyl in place of the iridium tris allyl. Similar results were obtained with both the electron microprobe analysis and RBS showing a composition of 98% rhodium and 2% carbon and transmission electron micrographs of the metal film at 21° C. showing a very fine grained structure with metal grain sizes of about 39 nanometers plus or minus 18 nanometers.

COMPARATIVE EXAMPLE 1

A comparative run was conducted in substantial accordance with run 14 of Espuler et al., Appl. Phys. A 48, 373-375 (1989). The deposition system involved injecting the precursor together through the same inlet port as the plasma. The slight differences from the reference included a sapphire substrate in place of the glass substrate, a substrate temperature of about 125° to 130° C. in place of 150° C., and a power of 0.06 W/cm$^2$ in place of 0.037 W/cm$^2$. Electron microprobe analysis and RBS showed a composition of 94% rhodium and 6% carbon.

Although the present invention has been described with reference to specific details, it is not intended that such details should be regarded as limitations upon the scope of the invention, except as and to the extent that they are included in the accompanying claims.

What is claimed is:

1. A nanocrystalline film comprised of a substantially carbon-free metal selected from the group consisting of rhodium, iridium, molybdenum, tungsten, rhenium, platinum, or palladium, said film having a metal content of at least 97% by weight, said film having a thickness of from about 10 nanometers to about 250 nanometers, and said film having a crystalline structure therein with a metallic grain size of from about 2 to about 40 nanometers, said film further characterized as having a substantially narrow distribution of crystal grain sizes within said film.

2. The film of claim 1 wherein the substantially carbon-free metal is rhodium.

3. The film of claim 1 wherein the substantially carbon-free metal is iridium.

4. The film of claim 1 wherein the metallic grain size is from about 2 to about 4 nanometers.

5. The film of claim 1 wherein the metal content of the film is at least 98% by weight.

6. An article comprised of a thermally sensitive substrate having a nanocrystalline coating thereon of a substantially carbon-free metal selected from the group consisting of rhodium, iridium, molybdenum, tungsten, rhenium, platinum, or palladium, said coating having a metal content of at least 97% by weight, said coating having a thickness of from about 10 nanometers to about 250 nanometers, and said coating having a crystalline structure therein with a metallic grain size of from about 2 to about 40 nanometers, said coating further characterized as having a substantially narrow distribution of crystal grain sizes within said coating.

7. The article of claim 6 wherein the substantially carbon-free metal is rhodium.

8. The article of claim 6 wherein the substantially carbon-free metal is iridium.

9. The article of claim 6 wherein the metallic grain size is from about 2 to about 4 nanometers.

10. A nanocrystalline film comprised of a substantially carbon-free metal selected from the group consisting of rhodium, iridium, molybdenum, tungsten, rhenium, platinum, or palladium, said film having a metal content of at least 97% by weight, said film having a thickness of from about 10 nanometers to about 250 nanometers, and said film having a crystalline structure therein with a metallic grain size of from about 2 to about 40 nanometers, said film further characterized as having a substantially narrow distribution of crystal grain sizes within said film, said film prepared by the process comprising passing: (a) a first gaseous stream including an inert gas and a precursor compound selected from the group consisting of rhodium(allyl)$_3$, iridium(allyl)$_3$, molybdenum(allyl)$_4$, tungsten(allyl)$_4$, rhenium(allyl)$_4$, platinum(allyl)$_2$, or palladium(allyl)$_2$ or the same wherein said allyl groups are substituted allyl groups; and, (b) a second gaseous stream including a hydrogen plasma, onto a heated target substrate for sufficient time to form said carbon-free metal film, said substrate heated at temperatures sufficient to decompose the precursor compound.

11. The film of claim 10 wherein the target substrate is a thermally sensitive substrate and the heating at temperatures sufficient to decompose the precursor compound is insufficient to adversely affect the target substrate.

12. The film of claim 10 wherein the target substrate is heated at temperatures of from about 225° C. to about 275° C.

13. A process of using a hydrogen plasma to form a substantially carbon-free nanocrystalline film of a metal selected from the group consisting of rhodium, iridium, molybdenum, tungsten, rhenium, platinum, or palladium from the chemical vapor deposition of an organometallic precursor containing one of said metals, said film having a metal content of at least about 97% by weight, said film having a thickness of from about 10 nanometers to about 250 nanometers, and said film having a crystalline structure therein with a metallic grain size of from about 2 to about 40 nanometers, said process comprising:

passing a first gaseous stream including an inert gas and a carbon-containing precursor compound selected from the group consisting of rhodium(allyl)$_3$, iridium(allyl)$_3$, molybdenum(allyl)$_4$, tungsten(allyl)$_4$, rhenium(allyl)$_3$, platinum(allyl)$_2$, or palladium(allyl)$_2$ or the same wherein said allyl groups are substituted allyl groups onto a heated target substrate; and simultaneously passing a second gaseous stream including a hydrogen plasma onto the heated target substrate, said heated target substrate at temperatures sufficient to decompose the carbon-containing precursor compound, and said first gaseous stream and said second gaseous stream passed simultaneously onto the heated substrate for sufficient time to form the substantially carbon-free metal film.

14. The process of claim 13 wherein the target substrate is a thermally sensitive substrate and the heating at temperatures sufficient to decompose the carbon-containing precursor compound is insufficient to adversely affect the target substrate.

15. The process of claim 13 wherein the target substrate is heated at temperatures from about 225° C. to about 275° C.

16. A process of using a hydrogen plasma to minimize the carbon content of a metallic film prepared from one or more organometallic precursor compounds, said process comprising:

passing a first gaseous stream including the one or more organometallic precursor compounds for said metallic film and an inert gas onto a heated target substrate; and, simultaneously passing a second gaseous stream including a hydrogen plasma onto the heated target substrate, said heated substrate at temperatures sufficient to decompose the one or more organometallic precursor compounds, and said first gaseous stream and said second gaseous stream passed simultaneously onto the heated substrate for sufficient time to form a substantially carbon-free metal film.

17. The process of claim 16 wherein the target substrate is a thermally sensitive substrate and the heating at temperatures sufficient to decompose the one or more organometallic precursor compounds is insufficient to adversely affect the target substrate.

18. The process of claim 17 wherein the target substrate is heated at temperatures from about 225° C. to about 275° C.

19. In a process of preparing a metal film of a metal selected from the group consisting of rhodium, iridium, molybdenum, tungsten, rhenium, platinum, or palladium from the chemical vapor deposition of an organometallic precursor containing one of said metals by passing a first gaseous stream including an inert gas and a carbon-containing precursor compound selected from the group consisting of rhodium(allyl)$_3$, iridium(allyl)$_3$, molybdenum(allyl)$_4$, tungsten(allyl)$_4$, rhenium(allyl)$_3$, platinum(allyl)$_2$, palladium(allyl)$_2$ or the same wherein said allyl groups are substituted allyl groups, onto a heated target substrate at temperatures sufficient to decompose the carbon-containing precursor compound to form a metal film upon said substrate, the improvement comprising:

simultaneously passing a second gaseous stream including a hydrogen plasma onto the heated target substrate for sufficient time whereby the resultant metal film is a substantially carbon-free nanocrystalline metal film having a metal content of at least about 97% by weight, a thickness of from about 10 nanometers to about 250 nanometers, and a crystalline structure therein with a metallic grain size of from about 2 to about 40 nanometers.

20. In the process of claim 19 wherein the improvement further comprises the target substrate being a thermally sensitive substrate and the substrate at temperatures sufficient to decompose the carbon-containing precursor compound but insufficient to adversely affect the target substrate.

21. In the process of claim 19 the improvement wherein the target substrate is heated at temperatures from about 225° C. to about 275° C.

22. In a process of preparing a metallic film from one or more organometallic precursor compounds by passing for sufficient time to form said metal film a first gaseous stream including the one or more organometallic precursor compounds and an inert gas onto a heated target substrate at temperatures sufficient to decompose the one or more organometallic precursor compounds, the improvement comprising:

simultaneously passing a second gaseous stream including a hydrogen plasma onto the heated target substrate whereby the resultant metal film is substantially carbon-free.

23. In the process of claim 22 wherein the improvement further comprises the target substrate being a thermally sensitive substrate and the substrate at temperatures sufficient to decompose the one or more organometallic precursor compounds but insufficient to adversely affect the target substrate.

24. In the process of claim 23 the improvement wherein the target substrate is heated at temperatures from about 225° C. to about 275° C.

* * * * *